(12) United States Patent
Wang et al.

(10) Patent No.: US 12,531,342 B2
(45) Date of Patent: Jan. 20, 2026

(54) DISPLAY SUBSTRATE AND MANUFACTURING METHOD THEREOF, DISPLAY MODULE, AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Wei Wang, Beijing (CN); Ming Yang, Beijing (CN); Weifeng Zhou, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 737 days.

(21) Appl. No.: 17/795,572

(22) PCT Filed: May 31, 2021

(86) PCT No.: PCT/CN2021/097470
§ 371 (c)(1),
(2) Date: Jul. 27, 2022

(87) PCT Pub. No.: WO2022/252075
PCT Pub. Date: Dec. 8, 2022

(65) Prior Publication Data
US 2023/0088027 A1    Mar. 23, 2023

(51) Int. Cl.
*H01L 23/66* (2006.01)
*H01L 23/06* (2006.01)
(Continued)

(52) U.S. Cl.
CPC ............... *H01Q 7/00* (2013.01); *H01L 23/06* (2013.01); *H10K 77/00* (2023.02); *H01L 2223/6677* (2013.01); *H10K 59/873* (2023.02)

(58) Field of Classification Search
CPC .............. H10Q 7/00; H01L 2223/6677; G06F 3/0443–0446
See application file for complete search history.

(56) References Cited

U.S. PATENT DOCUMENTS

| | | |
|---|---|---|
| 9,881,947 B2 | 1/2018 | He et al. |
| 2010/0207506 A1 | 8/2010 | Kwon |

(Continued)

FOREIGN PATENT DOCUMENTS

| | | |
|---|---|---|
| AU | 2016216322 B2 | 3/2019 |
| CN | 201138593 Y | 10/2008 |

(Continued)

OTHER PUBLICATIONS

Choi et al, "Efficient NFC Coil Antennas for Fully Enclosed Metallic-Framed Wearable Devices", The Institute of Engineering and Technology, vol. 14, Issue 3, 2020, pp. 211-214.

(Continued)

*Primary Examiner* — Tuan A Hoang
(74) *Attorney, Agent, or Firm* — Dority & Manning, PA

(57) ABSTRACT

A display substrate has a display area and a peripheral area adjacent to the display area. The display substrate includes; a substrate; an antenna wiring disposed on a side of the substrate; the antenna wiring being located in the peripheral area and arranged around the display area; and at least one conductive layer located on the side of the substrate. The antenna wiring is arranged in a same layer as the at least one conductive layer.

17 Claims, 11 Drawing Sheets

(51) Int. Cl.
  *H01Q 7/00* (2006.01)
  *H10K 77/00* (2023.01)
  *H10K 59/80* (2023.01)

(56) References Cited

U.S. PATENT DOCUMENTS

| | | | |
|---|---|---|---|
| 2015/0022081 A1 | 1/2015 | Li et al. | |
| 2015/0041786 A1 | 2/2015 | Li et al. | |
| 2016/0209958 A1* | 7/2016 | Choi | G06F 3/0418 |
| 2019/0220123 A1* | 7/2019 | Kanaya | H10K 59/40 |
| 2020/0266542 A1 | 8/2020 | Mu et al. | |
| 2022/0231097 A1 | 7/2022 | Wang et al. | |
| 2024/0072415 A1* | 2/2024 | Peng | H01Q 21/24 |

FOREIGN PATENT DOCUMENTS

| | | | | |
|---|---|---|---|---|
| CN | 104240625 A | | 12/2014 | |
| CN | 204129780 U | | 1/2015 | |
| CN | 104485983 | * | 4/2015 | G06F 3/0412 |
| CN | 104574545 A | | 4/2015 | |
| CN | 205247351 U | | 5/2016 | |
| CN | 105808000 B | | 7/2016 | |
| CN | 207541540 U | | 6/2018 | |
| CN | 209880795 U | | 12/2019 | |
| CN | 111525232 A | * | 8/2020 | H10D 86/60 |
| CN | 112051936 A | | 12/2020 | |
| CN | 112578925 A | | 3/2021 | |
| WO | WO 2015/171118 A1 | | 11/2015 | |

OTHER PUBLICATIONS

Qianhui et al, "A Design and Implementation of Access Point to the Internet of Things Based on NFC", with English Abstract, School of Electronics and Electrical Engineering, Shanghai, Peoples Republic of China. Dec. 2014, 100 pages.

Qian-hui et al, "The OLED Wireless Control System Based on NFC", with English Translation, 2015, 13 pages.

PCT International Search Report (w/ English translation) and Written Opinion for PCT Application No. PCT/CN2021/097470, mailed Jan. 27, 2022, 9 pages.

Indian Office Action (with English translation) for corresponding Application No. 202347029566, dated June 9. 2025, 2 pages.

* cited by examiner

DISPLAY SUBSTRATE AND MANUFACTURING METHOD THEREOF, DISPLAY MODULE, AND DISPLAY APPARATUS

CROSS-REFERENCE TO RELATED APPLICATION

This application is a national phase entry under 35 USC 371 of International Patent Application No. PCT/CN 2021/097470 filed on May 31, 2021, which is incorporated herein by reference in its entirety.

TECHNICAL FIELD

The present disclosure relates to the field of display technologies, and in particular, to a display substrate and a manufacturing method thereof, a display module, and a display apparatus.

BACKGROUND

Radio frequency identification (RFC) is a wireless communication technology, which can identify a specific target, and read and write relevant data through radio signals without establishing a mechanical or optical contact between an identification system and the specific target.

A radio signal transmits data from a tag attached to an object through an electromagnetic field tuned to a radio frequency to automatically identify and track the object. Some tags may obtain energy from an electromagnetic field emitted by an identifier during identification, and do not need a battery. Alternatively, there are tags each having its own power source and actively emitting a radio wave (i.e., an electromagnetic field tuned to a radio frequency). The tag contains electronically stored information that may be identified within a few meters. Unlike a barcode, a radio frequency tag does not need to be within the line of sight of the identifier, and may be embedded within an object that is tracked.

SUMMARY

In an aspect, a display substrate is provided. The display substrate has a display area and a peripheral area adjacent to the display area. The display substrate includes a substrate, an antenna wiring disposed on a side of the substrate, and at least one conductive layer located on the side of the substrate. The antenna wiring is located in the peripheral area and arranged around the display area. The antenna wiring is arranged in a same layer as the at least one conductive layer.

In some embodiments, the at least one conductive layer includes a first touch electrode layer and a second touch electrode layer, and the second touch electrode layer is located on a side of the first touch electrode layer away from the substrate. The antenna wiring includes a first portion arranged in a same layer as the second touch electrode layer.

In some embodiments, the at least one conductive layer further includes a first source-drain electrode layer and a second source-drain electrode layer, and the second source-drain electrode layer is located between the first source-drain electrode layer and the first touch electrode layer. The antenna wiring further includes a second portion arranged in a same layer as the second source-drain electrode layer. The second portion and the first portion are connected in parallel through at least one first via hole in at least one insulating layer located between the second touch electrode layer and the second source-drain electrode layer.

In some embodiments, the antenna wiring further includes a third portion arranged in a same layer as the first touch electrode layer. The third portion and the first portion are connected in parallel through at least one second via hole in at least one insulating layer located between the first touch electrode layer and the second touch electrode layer. The first via hole penetrates through the third portion.

In some embodiments, along an extending direction of the antenna wiring, the first via hole and the second via hole are alternately arranged.

In some embodiments, the display substrate further includes an encapsulation layer located on a side of the first touch electrode layer proximate to the substrate. Orthogonal projections of the first via hole and the second via hole on the substrate are located outside an orthographic projection of the encapsulation layer on the substrate.

In some embodiments, the display substrate further includes a voltage signal line located in the peripheral area and surrounding the display area. The voltage signal line is arranged in a same layer as the first source-drain electrode layer or the second source-drain electrode layer. An orthographic projection of the antenna wiring on the substrate is located on a side, away from the display area, of an orthographic projection of the voltage signal line on the substrate.

In some embodiments, the display substrate further includes touch wirings. The touch wirings are arranged in a same layer as the first touch electrode layer or the second touch electrode layer; or part of the touch wirings are arranged in a same layer as the first touch electrode layer, and another part of the touch wirings are arranged in another same layer as the second touch electrode layer. At least a portion of an orthographic projection of the antenna wiring on the substrate is located on a side, proximate to an outer edge of the peripheral area, of orthographic projections of the touch wirings on the substrate.

In some embodiments, a first overlapped region exists between the orthographic projection of the antenna wiring on the substrate and the orthographic projections of the touch wirings on the substrate. In the first overlapped region, the antenna wiring and the touch wirings are arranged in different layers.

In some embodiments, the display substrate further includes at least one first blocking dam located in the peripheral area and arranged around the display area. An orthographic projection of the antenna wiring on the substrate is located on a side, away from the display area, of an orthographic projection of the at least one first blocking dam on the substrate; or the orthographic projection of the antenna wiring on the substrate is partially overlapped with an orthographic projection of a first blocking dam of the at least one first blocking dam farthest from the display area on the substrate.

In some embodiments, the display substrate further includes an inorganic insulating layer and a second blocking dam. The inorganic insulating layer is located on a surface of the substrate proximate to the conductive layer. The inorganic insulating layer extends from the display area to the peripheral area, and a portion of the inorganic insulating layer away from the display area includes at least one groove. An orthographic projection of the second blocking dam on the substrate is overlapped with an orthographic projection of the at least one groove on the substrate.

In some embodiments, the antenna wiring surrounds the display area to form a single-turn coil, and the single-turn coil extends at least from a first position of a side of the display area around the display area to a second position of the side of the display area that is opposite to the first position.

In some embodiments, the antenna wiring includes a multi-turn coil that is spirally arranged along a direction parallel to the substrate and away from the display area. One of turns of the multi-turn coil proximate to the display area is a first coil. The antenna wiring further includes an extending portion connected to an open end of the first coil. A second overlapped region exists between an orthographic projection, on the substrate, of the extending portion and an orthographic projection, on the substrate, of at least one of the turns of the multi-turn coil except the first coil, and the at least one turn is a second coil. In the second overlapped region, the extending portion is arranged in a different layer from the second coil.

In some embodiments, a distance from a boundary, proximate to the display area, of an orthographic projection of the antenna wiring on the substrate to a boundary of the display area is greater than or equal to about 20 μm.

In some embodiments, the display substrate further has a bonding region located on a side of the peripheral area away from the display area. The display substrate further includes two antenna pins located in the bonding region. An input end of the antenna wiring is connected to one of the antenna pins, and an output end of the antenna wiring is connected to another one of the antenna pins.

In another aspect, a display module is provided. The display module includes the display substrate in any one of the above embodiments and a flexible printed circuit bonded to the display substrate. The flexible printed circuit has a matching circuit coupled to the antenna wiring and a near field communication chip coupled to the matching circuit.

In some embodiments, the display module further includes a micro control unit coupled to the near field communication chip.

In yet another aspect, a display apparatus is provided. The display apparatus includes the display module in any one of the above embodiments and a power module. The power module is configured to supply power to the display module.

In yet another aspect, a manufacturing method of a display substrate is provided. The display substrate has a display area and a peripheral area adjacent to the display area. The manufacturing method of the display substrate includes: providing a substrate; forming an antenna wiring on a side of the substrate, the antenna wiring being located in the peripheral area and arranged around the display area; and forming at least one conductive layer on the side of the substrate. The antenna wiring is manufactured in a same layer as the at least one conductive layer.

In some embodiments, the antenna wiring includes a multi-turn coil that is spirally arranged along a direction perpendicular to the substrate. The at least one conductive layer includes a plurality of conductive layers, and every two adjacent conductive layers are provided with at least one insulating layer therebetween. Two adjacent turns of the multi-turn coil are connected in series through at least one third via hole in the at least one insulating layer.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and an actual timing of a signal to which the embodiments of the present disclosure relate.

DETAILED DESCRIPTION

Figure 1:
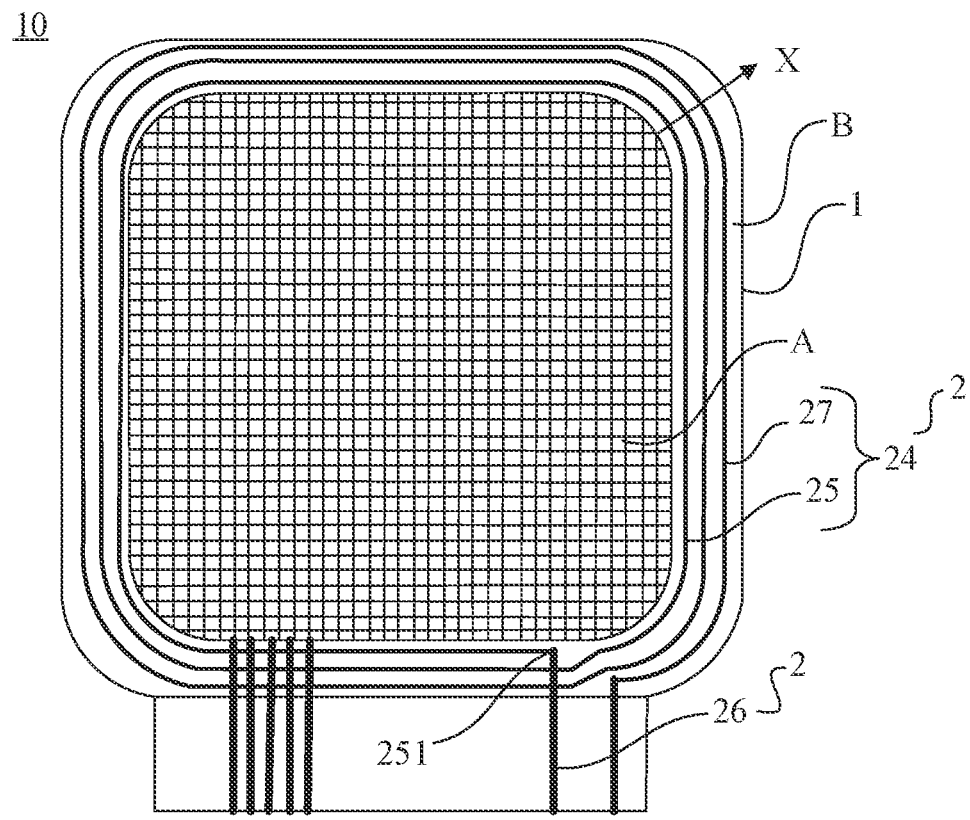
FIG. 1 is a structural diagram of a display substrate, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the terms such as "coupled" and "connected" and extensions thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

The use of the phase "applicable to" or "configured to" herein means an open and inclusive expression, which does not exclude devices that are applicable to or configured to perform additional tasks or steps.

In addition, the use of the phase "based on" means openness and inclusiveness, since a process, step, calculation or other action that is "based on" one or more stated conditions or values may, in practice, be based on additional conditions or values exceeding those stated.

As used herein, the term such as "about" or "approximately" includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

"Same layer" means that a film layer for forming a specific pattern is formed by a same film forming process, and then is patterned by one patterning process using a same mask to form a layer structure. Depending on different specific patterns, the one patterning process may include several exposure, development or etching processes, and the specific patterns in the formed layer structure may be continuous or discontinuous, and these specific patterns may also be at different heights or have different thicknesses.

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Figure 2A:
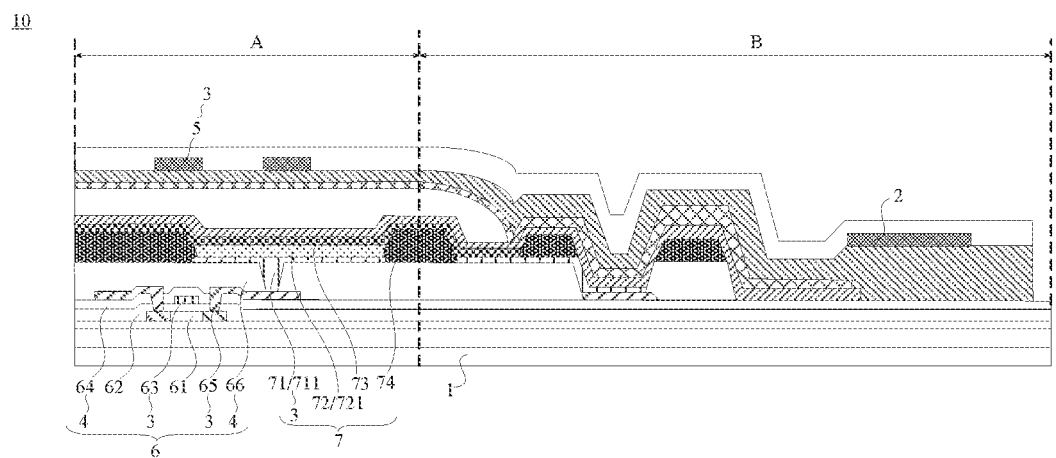
FIG. 2A is a structural diagram of another display substrate, in accordance with some embodiments.
Figure 2B:
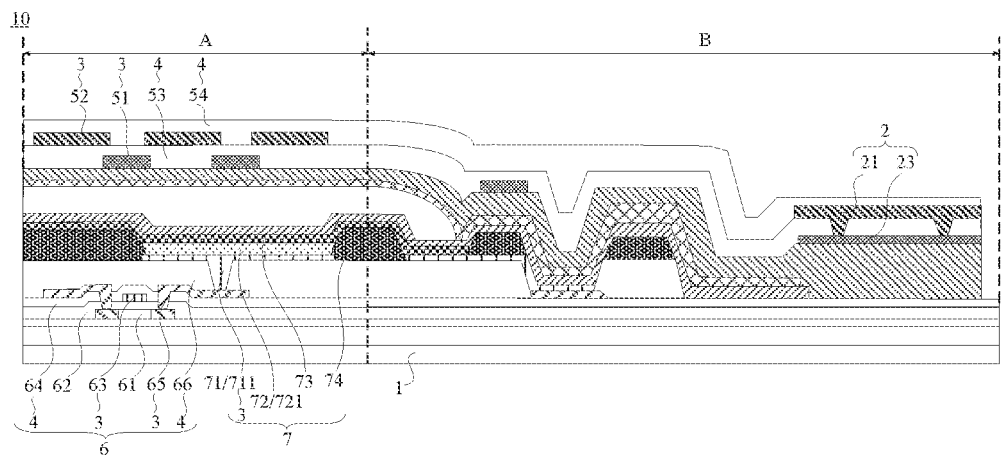
FIG. 2B is a structural diagram of yet another display substrate, in accordance with some embodiments.

As shown in FIGS. 1, 2A and 2B, some embodiments of the present disclosure provide a display substrate 10. The display substrate 10 has a display area A and a peripheral area B adjacent to the display area A. The display substrate 10 includes a substrate 1, an antenna wiring 2 disposed on a side of the substrate 1, and at least one conductive layer 3 located on the side of the substrate 1. The antenna wiring 2 is located in the peripheral area B, and is arranged around the display area A. The antenna wiring 2 is arranged in same layer as the at least one conductive layer 3.

The substrate 1 may be made of glass.

The antenna wiring 2 is arranged in the same layer as the at least one conductive layer 3, which may mean that the antenna wiring 2 is arranged in a same layer as a conductive layer 3 (as shown in FIG. 2A), or the antenna wiring 2 is arranged in same layers as conductive layers 3 (as shown in FIG. 2B). It is worth noting that as shown in FIGS. 2A and 2B, in a case where the display substrate 10 includes the plurality of conductive layers 3, every two adjacent conductive layers 3 are provided with at least one insulating layer 4 therebetween.

In some embodiments of the present disclosure, the antenna wiring 2 is integrated into the display substrate 10, and the antenna wiring 2 is located in the peripheral area B of the display substrate 10, so that a display apparatus in which the display substrate 10 is used is able to realize a normal display function, and is also able to realize a near field communication (NFC) function. Moreover, the antenna wiring 2 is arranged in the same layer as the at least one conductive layer 3, which is able to simplify a manufacturing process of the display apparatus and reduce costs. In this way, a complexity of wirings in the display apparatus is able to be reduced compared with the related art in which an antenna wiring is disposed on a substrate of a display apparatus other than a display substrate. In addition, compared with the related ark in which the antenna wiring is disposed on the substrate of the display apparatus other than the display substrate, in some embodiments of the present disclosure, the antenna wiring 2 is disposed in the display substrate 10, and when an NFC identification is performed, the antenna wiring 2 may be closer to a sensing point, resulting in a better sensing performance.

In some embodiments, the display substrate 10 may be a touch display substrate. In some examples, as shown in FIG. 2A, the display substrate 10 may include a touch electrode layer 5, and in this case, the at least one conductive layer 3 includes the touch electrode layer 5. The antenna wiring 2 may be arranged in a same layer as the touch electrode layer 5.

In some other examples, as shown in FIG. 2B, the display substrate 10 may include a first touch electrode layer 51 and a second touch electrode layer 52. The second touch electrode layer 52 is located on a side of the first touch electrode layer 51 away from the substrate. In this case, the at least one conductive layer 3 may include the first touch electrode layer 51 and the second touch electrode layer 52. The antenna wiring 2 includes a first portion 21 arranged in a same layer as the second touch electrode layer 52.

For example, the first touch electrode layer 51 and the second touch electrode layer 52 each may be made of metal, such as aluminum (Al), silver (Ag), tungsten (W), copper (Cu), nickel (Ni), chromium (Cr), molybdenum (Mo), titanium (Ti), platinum (Pt), tantalum (Ta), neodymium (Nd) or scandium (Sc), Alternatively, the first touch electrode layer 51 and the second touch electrode layer 52 each may be made of an alloy or a nitride of any one of the above metals, or a combination of at least two of the above metals, For example, the display substrate 10 may further include a fifth insulating layer 53 located between the first touch electrode layer 51 and the second touch electrode layer 52, and a sixth insulating layer 54 located on a side of the second touch electrode layer 52 away from the first touch electrode layer 51. The fifth insulating layer 53 and the sixth insulating layer 54 each may be made of an inorganic material, such as silicon oxide ($SiO_x$), silicon nitride ($SiN_x$), silicon oxynitride (SiON), aluminum oxide ($Al_2O_3$), titanium oxide ($TiO_2$), tantalum pentoxide ($Ta_2O_5$), hafnium dioxide ($HfO_2$) or tin oxide ($ZnO_2$). Alternatively, the fifth insulating layer 53 and the sixth insulating layer 54 each may be made of an organic material, such as propylene, polyolefin, polyimide (PI), polyurethane, polyethylene terephthalate (PET), polyethylene naphthalate two formic acid glycol ester (PEN), polybutylene terephthalate (PBT) or polyethersulfone (PES).

The fifth insulating layer 53 is used for insulating the first touch electrode layer 51 and the second touch electrode layer 52 from each other. The sixth insulating layer 54 is used for protecting the second touch electrode layer 52 to prevent water vapor and oxygen from corroding the second touch electrode layer 52.

For example, the first touch electrode layer 51 may include a grid-shaped touch electrode, and/or the second touch electrode layer 52 may include a grid-shaped touch electrode.

In this arrangement, the antenna wiring 2 is integrated into the touch display substrate, so that the display substrate 10 is able to realize a touch function and the near field communication function. Moreover, since the antenna wiring 2 includes the first portion 21 arranged in the same layer as the second touch electrode layer 52, the antenna wiring 2 is closer to a sensing point, resulting in a better sensing performance and a higher sensitivity.

Figure 3:
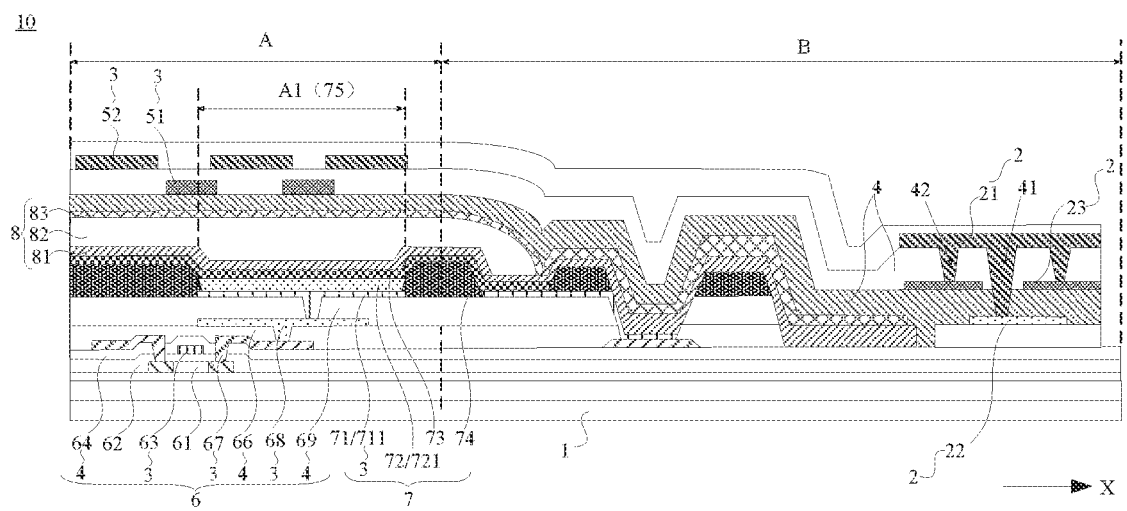
FIG. 3 is a structural diagram of yet another display substrate, in accordance with some embodiments.

In some embodiments, the display substrate 10 may be an organic light-emitting diode (OLED) display substrate. In this case, as shown in FIGS. 2A, 2B and 3, the display substrate 10 may include a circuit structure layer 6 located on the side of the substrate 1 and a light-emitting functional layer 7 located on a side of the circuit structure layer 6 away from the substrate 1, In some other embodiments, the display substrate 10 may be a liquid crystal display (LCD) substrate. In this case, the display substrate 10 may include a circuit structure layer, a pixel electrode layer, a common electrode layer, a liquid crystal layer and an opposite substrate that are away from the substrate 1 in sequence.

In a case where the display substrate is the OLED display substrate, a plurality of pixel driving circuits may be formed in the circuit structure layer 6, and each pixel driving circuit may include a plurality of thin film transistors and storage capacitor(s). In some examples, the thin film transistors may be top-gate thin film transistors. In some other examples, the thin film transistors may be bottom-gate thin film transistors.

A thin film transistor may include a semiconductor pattern of a semiconductor layer, a gate, a source and a drain.

In some examples, as shown in FIGS. 2A and 2B, in a case where the thin film transistors are the top-gate thin film transistors, the circuit structure layer 6 may include the semiconductor layer 61, a first insulating layer 62, a gate layer 63, a second insulating layer 64, a source-drain electrode layer 65 and a third insulating layer 66 that are away from the substrate 1 in sequence.

In some other examples, as shown in FIG. 3, in a case where the thin film transistors are the top-gate thin film transistors, the circuit structure layer 6 may include a semiconductor layer 61, a first insulating layer 62, a gate layer 63, a second insulating layer 64, a first source-drain electrode layer 67, a third insulating layer 66, a second source-drain electrode layer 68 and a fourth insulating layer 69 that are away from the substrate 1 in sequence.

In yet other examples, in a case where the thin film transistors are the bottom-gate thin film transistors, the circuit structure layer 6 may include a gate layer, a gate insulating layer, a semiconductor layer, a source-drain electrode layer and a planarization layer that are away from the substrate 1 in sequence.

The gate layer 63 may be made of metal, such as molybdenum (Mo). The source-drain electrode layer 65 may be of a single-layer structure or a multi-layer structure. For example, the source-drain electrode layer 65 may include a titanium metal layer, an aluminum metal layer and another titanium metal layer that are sequentially stacked. For example, the first source-drain electrode layer 67 may include a titanium metal layer, an aluminum metal layer and another titanium metal layer that are sequentially stacked. The second source-drain electrode layer 68 may include a titanium metal layer, an aluminum metal layer and another titanium metal layer that are sequentially stacked.

For example, as shown in FIGS. 2A, 2B and 3, the light-emitting functional layer 7 may include an anode layer 71, an organic light-emitting layer 72 and a cathode layer 73 that are away from the circuit structure layer 6 in sequence. For example, the anode layer 71 may be made of metal, such as silver (Ag), Alternatively, the light-emitting functional layer 7 may include an anode layer, a hole transport layer, an organic light-emitting layer, an electron transport layer and a cathode layer that are away from the circuit structure layer 6 in sequence. Alternatively, the light-emitting structure layer 7 may include an anode layer, a hole injection layer, a hole transport layer, an organic light-emitting layer, an electron transport layer, an electron injection layer and a cathode layer that are away from the circuit structure layer 6 in sequence.

As shown in FIGS. 2A, 2B and 3, the light-emitting functional layer 7 further includes a pixel defining layer 74. A plurality of through holes are provided in the pixel defining layer 74, and are used for exposing a plurality of anode patterns 711 in the anode layer 71. For example, the organic light-emitting layer 72 includes a plurality of organic light-emitting portions 721 respectively located in the plurality of through holes. The cathode layer 73 may cover the plurality of organic light-emitting portions and the pixel defining layer 74.

As shown in FIG. 3, a plurality of light-emitting devices 75 are formed in the light-emitting functional layer 7, and each light-emitting device 75 is located in a sub-pixel region A1 of the display area A. For example, a light-emitting device 75 may emit red light, or the light-emitting device 75 may emit blue light, or the light-emitting device 75 may emit green light, or the light-emitting device 75 may emit white light. An anode pattern 711, an organic light-emitting portion 721 and a portion of the cathode layer 73 located in a through hole constitute a light-emitting device 75.

Figure 4:
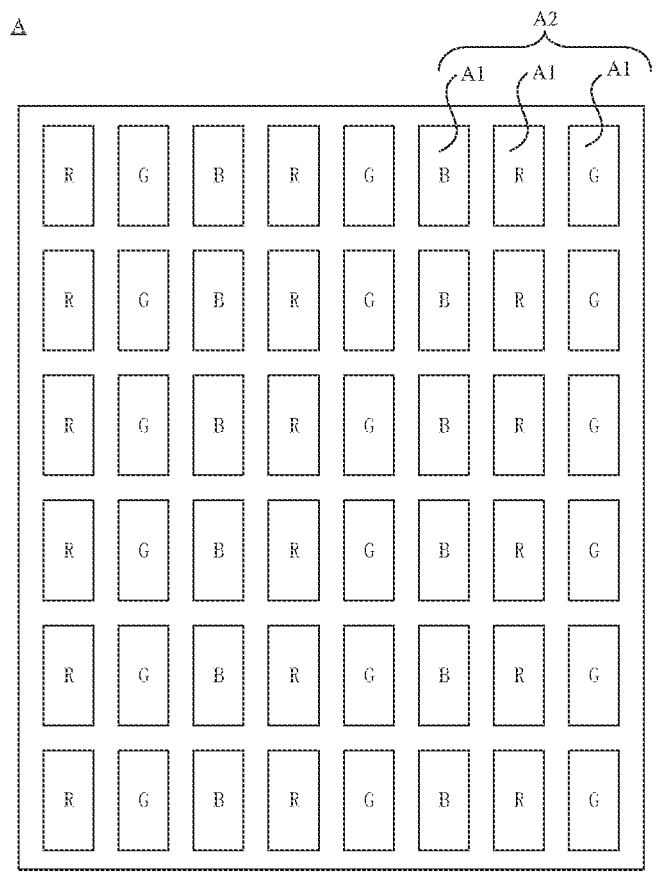
FIG. 4 is a structural diagram of a display area, in accordance with some embodiments.

As shown in FIG. 4, a plurality of sub-pixel regions A1 in the display area A may be divided into a plurality of pixel units A2. In some embodiments, each pixel unit A2 may include three sub-pixel regions A1 and the three sub-pixel regions A1 respectively emit light of three primary colors. Alternatively, in some other embodiments, each pixel unit A2 may include four sub-pixel regions A1, and the four sub-pixel regions A1 emit green light, red light, blue light and white light, respectively.

Figure 5:
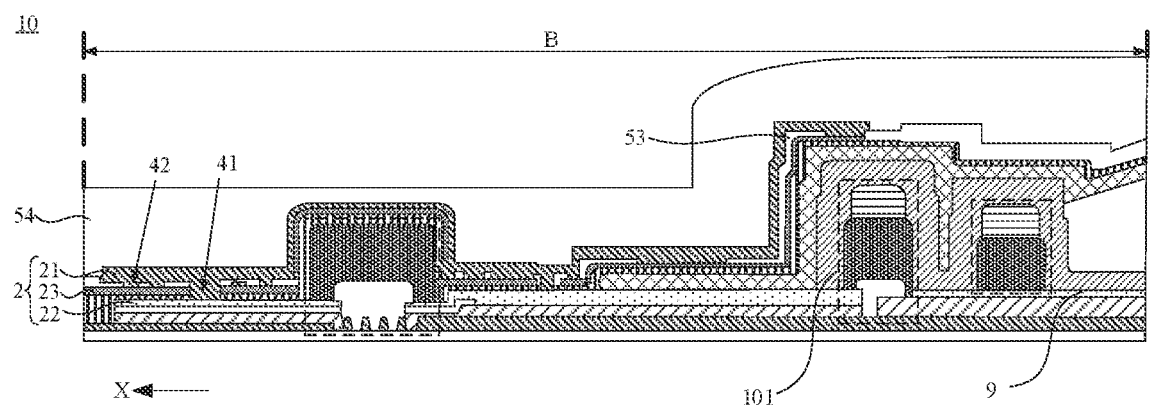
FIG. 5 is a structural diagram of yet another display substrate, in accordance with some embodiments.

In some embodiments, as shown in FIG. 3, the at least one conductive layer further includes the first source-drain electrode layer 67 and the second source-drain electrode layer 68, and the second source-drain electrode layer 68 is located between the first source-drain electrode layer 67 and the first touch electrode layer 51. As shown in FIGS. 3 and 5, the antenna wiring 2 further includes a second portion 22 arranged in a same layer as the second source-drain electrode layer 68. The second portion 22 and the first portion 21 are connected in parallel through at least one first via hole 41 in at least one insulating layer 4 located between the second touch electrode layer 52 and the second source-drain electrode layer 68.

The number of the first via hole(s) 41 and a shape of the first via hole 41 are not limited. For example, the number of the first via holes 41 may be five or six. For example, an orthogonal projection of the first via hole 41 on the substrate 1 may be approximately circular or approximately rectangular.

For example, the at least one insulating layer 4 may include the fifth insulating layer 53 located between the first touch electrode layer 51 and the second touch electrode layer 52, and an insulating layer located between the first touch electrode layer 51 and the light-emitting functional layer 7.

In this way, the first portion 21 of the antenna wiring 2 is arranged in the same layer as the second touch electrode layer 52, and the second portion 22 of the antenna wiring 2 is arranged in the same layer as the second source-drain electrode layer 68, so that the first portion 21 and the second touch electrode layer 52 are able to be formed through one patterning process, and the second portion 22 and the second source-drain electrode layer 68 are able to be formed through one patterning process, thereby simplifying a manufacturing process of the display substrate 10 that includes the antenna wiring 2 and reducing costs. The first portion 21 and the second portion 22 are connected in parallel, which is also able to reduce a resistance of the antenna wiring 2 and the power consumption of the antenna wiring 2, so as to improve the detection sensitivity of the antenna wiring 2.

In some embodiments, as shown in FIGS. 3 and 5, the antenna wiring 2 further includes a third portion 23 arranged in a same layer as the first touch electrode layer 51. The third portion 23 and the first portion 21 are connected in parallel through at least one second via hole 42 in at least one insulating layer 4 located between the first touch electrode layer 51 and the second touch electrode layer 52, and the first via hole 41 penetrates through the third portion 23.

The number of the second via hole(s) 42 and a shape of the second via hole 42 are not limited. For example, the number of the second via holes 42 may be five or six. For example, an orthogonal projection of the second via hole 42 on the substrate 1 may be approximately circular or approximately rectangular.

For example, the at least one insulating layer 4 may include the fifth insulating layer located between the first touch electrode layer 51 and the second touch electrode layer 52.

In this way, the first portion 21 is arranged in the same layer as the second touch electrode layer 52, the third portion 23 is arranged in the same layer as the first touch electrode layer 51, so that the first portion 21 and the second touch electrode layer 52 are able to be formed through one patterning process, the third portion 23 and the first touch electrode layer 51 are able to be formed through one patterning process, thereby simplifying the manufacturing process of the display substrate 10 that includes the antenna wiring 2 and reducing costs. The first portion 21 and the third portion 23 are connected in parallel, which is also able to reduce the resistance of the antenna wiring 2 and the power consumption of the antenna wiring 2, so as to improve the detection sensitivity of the antenna wiring 2.

In a case where the antenna wiring 2 includes the first portion 21, the second portion 22 and the third portion 23, the first portion 21 and the second portion 22 are connected in parallel through the at least one first via hole 41, and the first portion 21 and the third portion 23 are connected in parallel through the at least one second via hole 42, which is able to further reduce the resistance of the antenna wiring 2 and the power consumption of the antenna wiring 2, so as to improve the detection sensitivity of the antenna wiring 2.

It is worth mentioning that the second portion 22 arranged in the same layer as the second source-drain electrode layer 68 and the third portion 23 arranged in the same layer as the first touch electrode layer 51 are not directly connected in parallel through a via hole, but are connected in parallel through the first portion 21 arranged in the same layer as the second touch electrode layer 52. In this way, the at least one insulating layer 4 between the second source-drain electrode layer 68 and the first touch electrode layer 51 is able to be etched less, which enables less water vapor and oxygen to enter the light-emitting functional layer 7, thereby ensuring that the light-emitting functional layer emits light normally. Moreover, this arrangement may also simplify the manufacturing process of the display substrate 10, save the manufacturing time, and reduce the manufacturing €4 costs of the display substrate 10.

For example, along an extending direction of the antenna wiring 2, the first via hole(s) 41 and the second via hole(s) 42 are alternately arranged. The first via hole(s) 41 and the second via hole(s) 42 are alternately arranged, so that connection points between the first portion 21 and the second portion 22 are more uniformly distributed, and connection points between the first portion 21 and the third portion 23 are more uniformly distributed, thereby ensuring that the first portion 21 and the second portion 22 are more reliably connected to each other, and the first portion 21 and the third portion 23 are more reliably connected to each other, which further reduces the resistance of the antenna wiring 2.

In some embodiments, as shown in FIG. 3, the display substrate 10 may further include an encapsulation layer 8 located on a side of the first touch electrode layer 51 proximate to the substrate 1. The encapsulation layer 8 may encapsulate the light-emitting functional layer 7 on the substrate 1. Moreover, the encapsulation layer 8 may prevent water vapor and oxygen from entering the light-emitting functional layer 7, so that the light-emitting functional layer 7 is prevented from being incapable of emitting light normally due to the erosion of water vapor and oxygen.

In some examples, the encapsulation layer 8 may be of a single-layer structure. In some other examples, the encapsulation layer 8 may be of a multi-layer structure. For example, as shown in FIG. 3, in a case where the encapsulation layer 8 is of the multi-layer structure, the encapsulation layer 8 may include a first inorganic insulating layer 81, an organic insulating layer 82, and a second inorganic insulating layer 83 that are away from the light-emitting functional layer 7 in sequence.

In some embodiments, as shown in FIG. 3, orthogonal projections of all the first via hole(s) 41 and all the second via hole(s) 42 on the substrate 1 are located outside an orthographic projection of the encapsulation layer 8 on the substrate 1. In this way, when the first via hole(s) 41 and the second via hole(s) 42 are formed by etching, the encapsulation layer 8 may be prevented from being damaged, so as to prevent water vapor and oxygen from entering the light-emitting functional layer 7, so that the light-emitting functional layer 7 is prevented from being incapable of emitting light normally due to the erosion of water vapor and oxygen.

In some embodiments, as shown in FIG. 5, the display substrate 10 further includes a voltage signal line 9 located in the peripheral area B and surrounds the display area A. The voltage signal line 9 is arranged in a same layer as the first source-drain electrode layer 67 or the second source-drain electrode layer 68. An orthographic projection of the antenna wiring 2 on the substrate 1 is located on a side, away from the display area A, of an orthographic projection of the voltage signal line 9 on the substrate 1.

For example, the voltage signal line 9 is used for providing a low level (e.g., voltage source source, VSS) signal to the pixel driving circuits.

In this way, the orthographic projection of the antenna wiring 2 on the substrate 1 and the orthographic projection of the voltage signal line 9 on the substrate 1 do not have an overlapped region therebetween, so that influences of an induction capacitance generated between the antenna wiring 2 and the voltage signal line 9 on the sensing performance of the antenna wiring 2 and the normal operation of the pixel driving circuit are avoided.

The voltage signal line 9 is arranged in the same layer as the first source-drain electrode layer 67 or the second source-drain electrode layer 68, so that the voltage signal line 9 and the first source-drain electrode layer 67 (or the second source-drain electrode layer 68) may be formed through one patterning process, which simplifies the manufacturing process of the display substrate 10, and reduces the costs.

Figure 6:
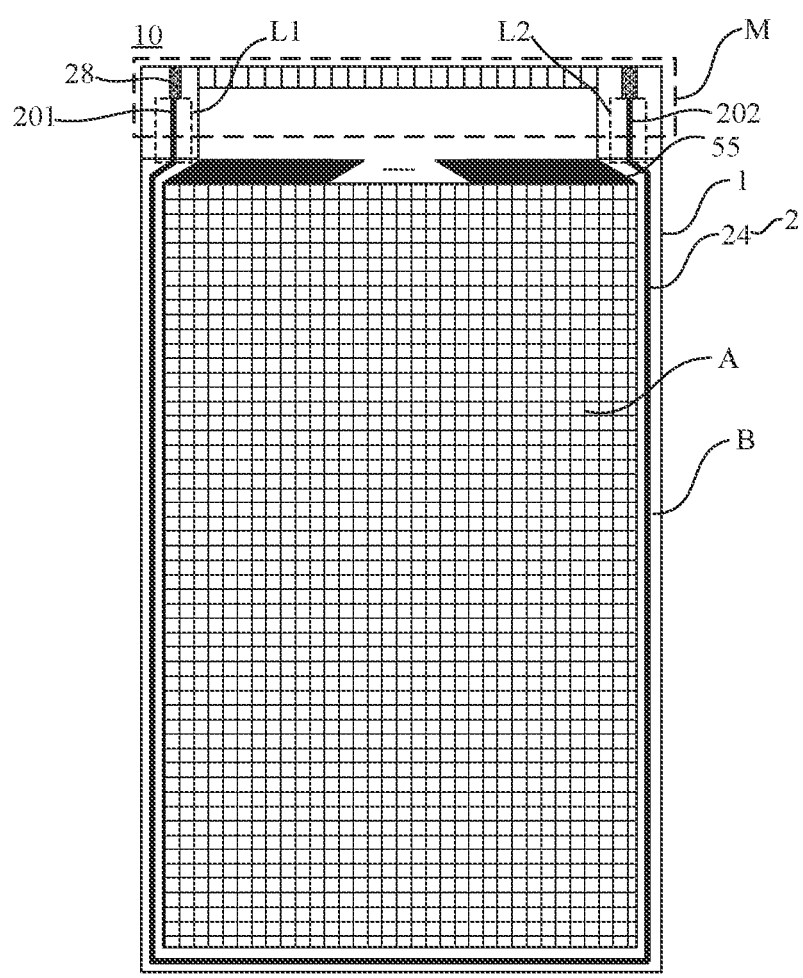
FIG. 6 is a top view of a display substrate, in accordance with some embodiments.
Figure 7:
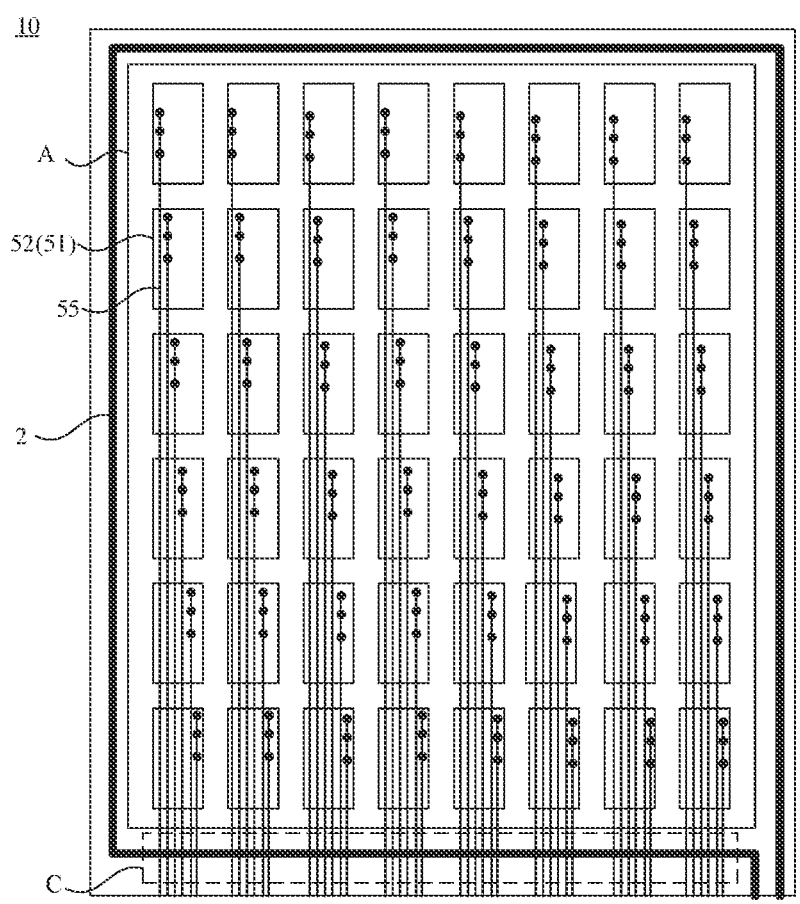
FIG. 7 is a top view of another display substrate, in accordance with some embodiments.

In some embodiments, as shown in FIGS. 6 and 7, the display substrate 10 may further include touch wirings 55, The touch wirings 55 are arranged in a same layer as the first touch electrode layer 51 or the second touch electrode layer 52; or part of the touch wirings are arranged in a same layer as the first touch electrode layer, and another part of the touch wirings are arranged in another same layer as the second touch electrode layer. At least a portion of the orthographic projection of the antenna wiring 2 on the substrate 1 is located on a side, proximate to an outer edge of the peripheral area B, of orthographic projections of the touch wirings 55 on the substrate 1.

Figure 8:
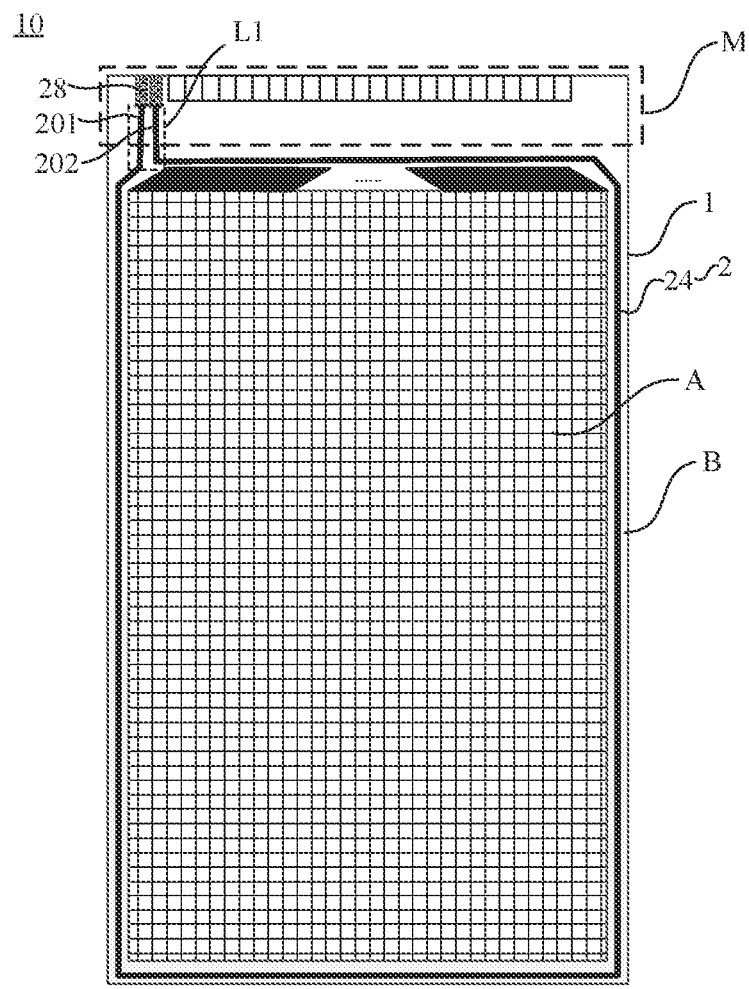
FIG. 8 is a top view of yet another display substrate, in accordance with some embodiments.

The entire orthographic projection of the antenna wiring 2 on the substrate 1 may be located on the side, proximate to the outer edge of the peripheral area B, of the orthographic projections of the touch wirings 55 on the substrate 1 (as shown in FIG. 6). Alternatively, a portion of the orthographic projection of the antenna wiring 2 on the substrate 1 may be located on the side, proximate to the outer edge of the peripheral area B, of the orthographic projections of the touch wirings 55 on the substrate 1 (as shown in FIGS. 7 and 8).

In this way, a distance between the antenna wiring 2 and the display area A is large, so as to avoid a poor display image in the display area due to shielding of the antenna wiring 2 on light emitted from the display area A.

Figure 9:
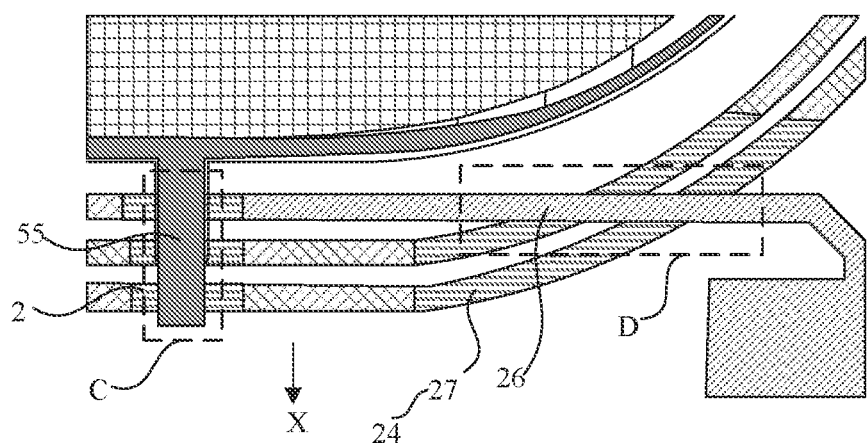
FIG. 9 is a structural diagram of yet another display substrate, in accordance with some embodiments.

In some embodiments, referring to FIGS. 7 and 9, a first overlapped region C exists between the orthographic projection of the antenna wiring 2 on the substrate 1 and the orthographic projections of the touch wirings 55 on the substrate 1. In the first overlapped region C, the antenna wiring 2 and the touch wirings are arranged in different layers.

In this way, the antenna wiring 2 is arranged to enable the display substrate to realize the near field communication function, and the antenna wiring 2 is prevented from being electrically connected to the touch wiring 55, thereby ensuring that both a touch signal transmitted by the touch wiring 55 and a sensing signal transmitted by the antenna wiring 2 are able to be accurately transmitted.

Figure 10:
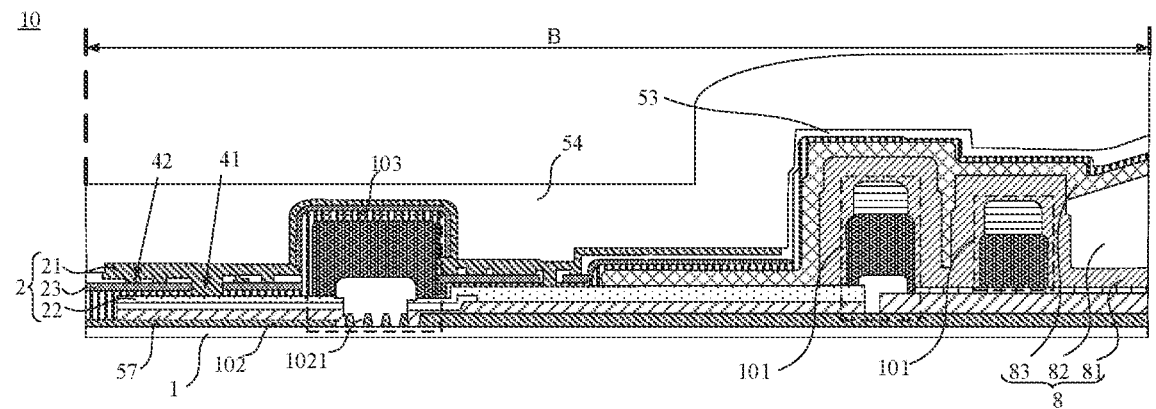
FIG. 10 is a structural diagram of yet another display substrate, in accordance with some embodiments.

In some embodiments, referring to FIGS. 5 and 10, the display substrate 10 further includes at least one first blocking dam 101. The at least one first blocking dam 101 is located in the peripheral area B, and is arranged around the display area A. The orthographic projection of the antenna wiring 2 on the substrate 1 is located on a side, away from the display area A, of orthographic projection(s) of the at least one first blocking dam 101 on the substrate 1 (as shown in FIG. 10). Alternatively, the orthographic projection of the antenna wiring 2 on the substrate 1 is partially overlapped with an orthographic projection of a first blocking dam 101 of all the first blocking dam(s) 101 farthest from the display area A on the substrate 1 (as shown in FIG. 5).

The at least one first blocking dam 101 may prevent a material of the organic insulating layer 82 from being diffused toward an edge portion of the display substrate 10 when the encapsulation layer 8 is manufactured.

In this way, the distance between the antenna wiring 2 and the display area A is large, so as to prevent the antenna wiring 2 from shielding the light emitted from the display area A and affecting the display effect of the display area.

In some embodiments, as shown in FIG. 10, the display substrate 10 further includes an inorganic insulating layer 102 and a second blocking dam 103. The inorganic insulating layer 102 is located on a surface of the substrate 1 proximate to the conductive layer(s) 3. The inorganic insulating layer 102 extends from the display area A to the peripheral area B. A portion of the inorganic insulating layer 102 away from the display area A includes at least one groove 1021. An orthographic projection of the second blocking dam 103 on the substrate 1 is overlapped with orthographic projection(s) of the at least one groove 1021 on the substrate 1.

The portion of the inorganic insulating layer 102 away from the display area A may include a groove 1021. Alternatively, the portion of the inorganic insulating layer 102 away from the display area may include a plurality of grooves 1021.

In this way, when the display substrate 10 is manufactured, the groove(s) 1021 may prevent outer crack(s) from propagating inward and affecting the display area, so that the reliability of the display substrate 10 may be improved. The second blocking dam 103 is provided to further prevent the crack(s) from propagating inward and affecting the display area.

In some embodiments, as shown in FIGS. 6 and 8, the antenna wiring 2 surrounds the display area A to form a single-turn coil 24, and the single-turn coil 24 extends at least from a first position L1 of a side of the display area A around the display area A to a second position L2 of the side of the display area A that is opposite to the first position L1.

In this way, on one hand, the normal display of the display area A of the display substrate 10 is not affected when the antenna wiring 2 is disposed on the display substrate 10. On another hand, compared with the antenna wiring 2 disposed on a side of the display area A, an area of a region enclosed by the antenna wiring 2, which extends from the side of the display area A around the display area A to the side of the display area A, is large, so that a magnetic flux of the antenna wiring 2 is increased during detection, which is beneficial to improving the NFC identification performance of the display substrate 10.

In some embodiments, as shown in FIGS. 1 and 9, the antenna wiring 2 includes a multi-turn coil 24 that is spirally arranged along a direction X parallel to the substrate 1 and away from the display area A. One of turns of the multi-coil 24 proximate to the display area A is a first coil 25. The antenna wiring 2 further includes an extending portion 26 that is connected to an open end 251 of the first coil 25. A second overlapped region D exists between an orthographic projection, on the substrate 1, of the extending portion 26 and orthographic projection(s), on the substrate 1, of at least one of the turns of the multi-turn coil 24 except the first coil 25, and the at least one turn is a second coil 27. In the second overlapped region D, the extending portion 26 is arranged in a different layer from the second coil 27.

In this way, in the second overlapped region D, the extending portion 26 is arranged in the different layer from the second coil 27, so that a problem that the antenna wiring 2 cannot transmit a sensing signal outward due to a short circuit between the extending portion 26 and the second coil 27 is avoided.

In some embodiments, in a case where only the single-turn coil 24 is provided, a width of the coil 24 may be about 700 μm. The phrase "about 700 μm" means that 5% of 700 μm may be fluctuated on the basis of 700 μm.

In some embodiments, as shown in FIG. 1, the antenna wiring 2 includes the multi-turn coil 24 that is spirally arranged along the direction X parallel to the substrate 1 and away from the display area A. In this way, the multi-turn coil 24 is disposed in the display substrate 10, which is beneficial to improving the detection sensitivity of the antenna wiring 2.

The antenna wiring 2 includes the multi-turn coil 24, which may be that the antenna wiring 2 includes a three-turn coil 24, or the antenna wiring 2 includes a four-turn coil 24. For example, in a case where the display substrate 10 has a width of 30 mm and a length of 30 mm, an inductance of the four-turn coil 24 may reach 1.4 μH, and an inductance of the three-turn coil 24 may reach 0.89 μH, The number of turns of the coil 24 included in the antenna wiring 2 is not limited, as long as an index inductance of the coil 24 is able to reach between 0.3 μH and 3 μH, and a quality factor of the coil 24 is greater than 5.

For example, when the number of turns of the coil 24 is designed, factors such as a width of the peripheral area B of the display substrate 10, a width of the coil 24, a distance between two adjacent turns of the coil 24, a material of the coil 24 and a structure of a film layer where the antenna wiring 2 is located may be considered.

Figure 11:
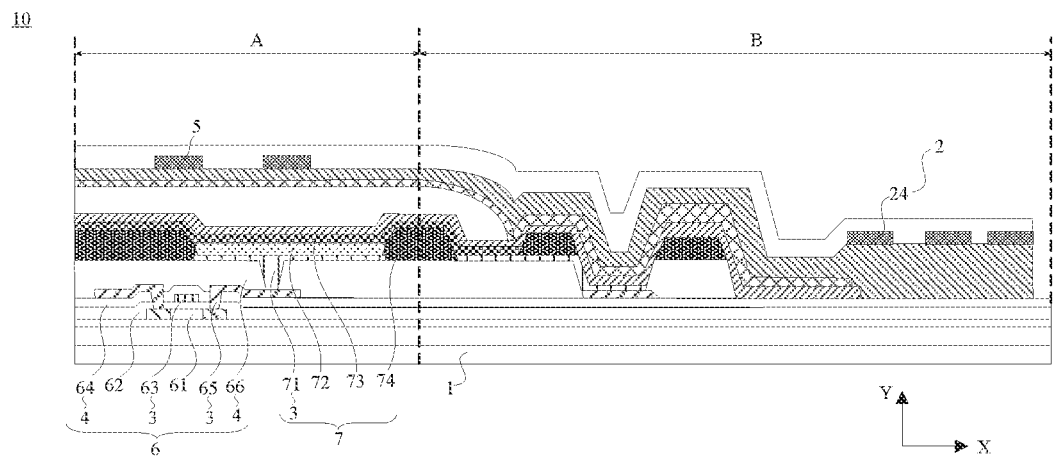
FIG. 11 is a structural diagram of yet another display substrate, in accordance with some embodiments.

In some embodiments, as shown in FIG. 11, the multi-turn coil 24 is arranged in a same layer as a conductive layer 3.

Figure 12:
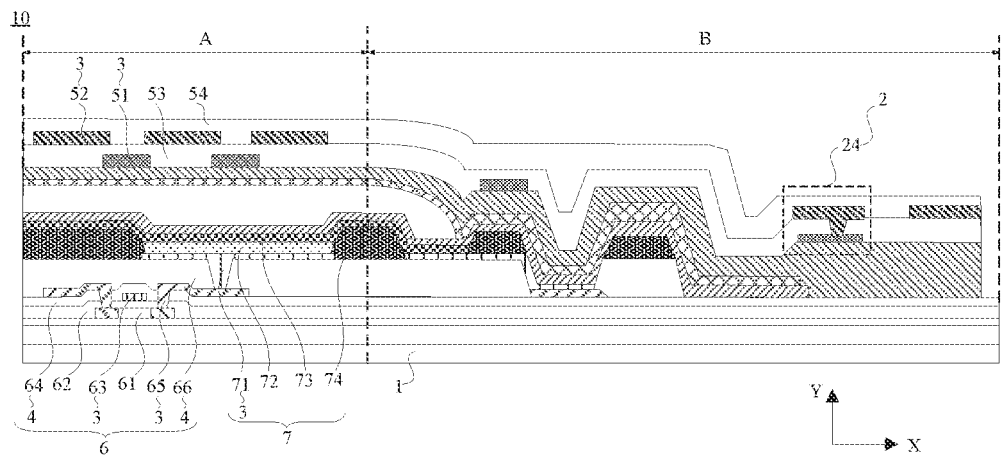
FIG. 12 is a structural diagram yet another display substrate; in accordance with some embodiments.

In some other embodiments, as shown in FIG. 12, at least one of the turns of the multi-turn coil 24 is arranged in same layers as conductive layers 3.

Figure 13:
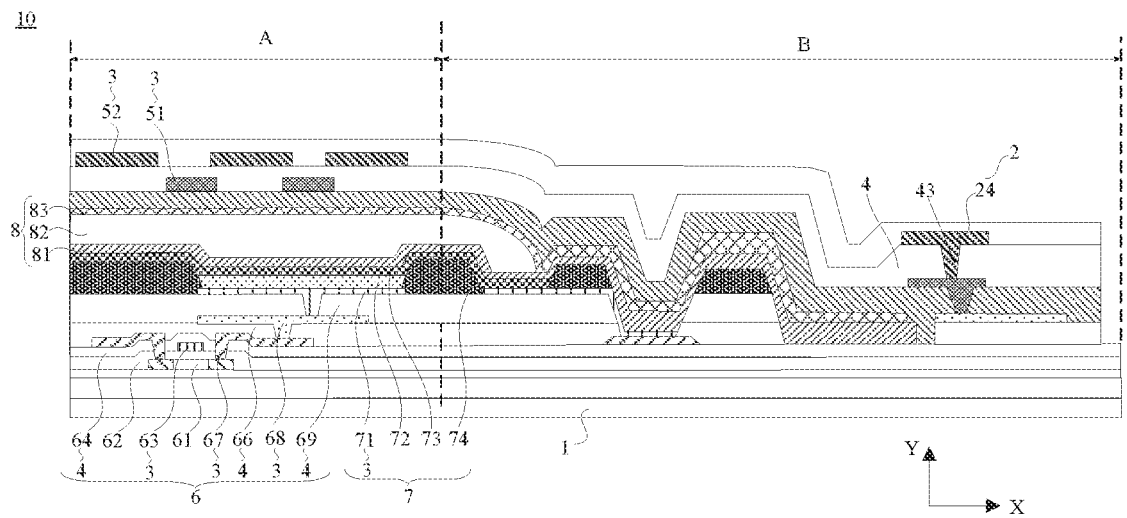
FIG. 13 is a structural diagram of yet another display substrate, in accordance with some embodiments.

In yet other embodiments, as shown in FIG. 13, the antenna wiring 2 includes a multi-turn coil 24 that is spirally arranged along a direction Y perpendicular to the substrate 1. Two adjacent turns of the coil 24 are connected in series through at least one third via hole 43 in at least one insulating layer 4.

In this way, along a direction parallel to the substrate 1, the number of turns of the coil 24 included in the antenna wiring 2 may be set to be small, and an area occupied by the orthographic projection of the antenna wiring 2 on the substrate 1 is small, so that the width of the peripheral area B of the display substrate 10 may be set to be small, so as to facilitate a narrow bezel design of the display apparatus in which the display substrate 10 is used. The mufti-turn coil 24 is provided along the direction Y perpendicular to the substrate 1, which is able to reduce the area of the orthographic projection of the antenna wiring 2 on the substrate 1, and is also able to increase the number of turns of the coil 24, and thus is beneficial to improving the sensitivity of the antenna wiring 2.

Figure 14:
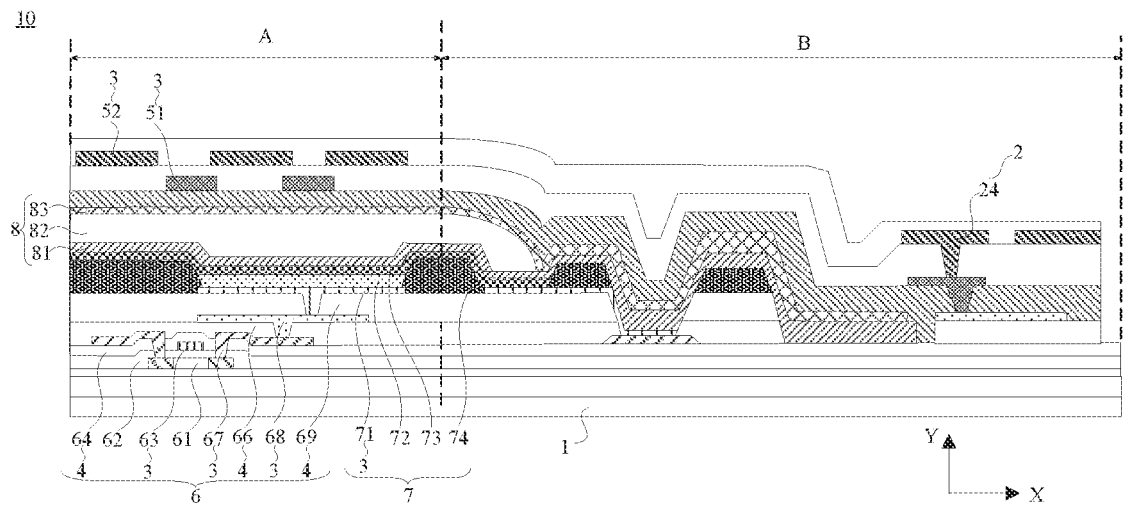
FIG. 14 is a structural diagram of yet another display substrate; in accordance with some embodiments.

In some embodiments, as shown in FIG. 14, the antenna wiring 2 includes a multi-turn coil 24. Every two adjacent conductive layers 3 have at least one insulating layer therebetween. The multi-turn coil 24 includes two portions connected in series, a portion of the multi-turn coil 24 is spirally arranged along the direction X parallel to the substrate 1 and away from the display area A, and another portion of the multi-turn coil 24 is spirally arranged along the direction Y perpendicular to the substrate 1. The another portion of the multi-turn coil 24 is arranged in same layers as conductive layers 3.

In this way, the antenna wiring 2 may include not only the portion of the multi-turn coil 24 that is spirally arranged along the direction X parallel to the substrate 1 and away from the display area A, but also include the another portion of the multi-turn coil 24 that is spirally arranged along the direction Y perpendicular to the substrate 1. In this way, along the direction parallel to the substrate 1, one of turns of the multi-turn coil 24 proximate to the display area A is able to cross other turns of the coil 24 through different layers, and to extend to a side of the other turns of the coil 24 away from the display area A, which is beneficial to simplifying the design of the antenna wiring 2.

In some embodiments, a line width of the antenna wiring 2 is about 50 μm to about 700 μm, Along the direction parallel to the substrate 1, a distance between two adjacent turns of the coil 24 is about 50 μm to 700 μm.

For example, the line width of the antenna wiring 2 may be 50 μm, 200 μm, 350 μm or 700 μm. For example, along the direction parallel to the substrate 1, the distance between two adjacent turns of the coil 24 may be 50 μm, 200 μm, 350 μm or 700 μm.

The phrase "about 50 μm" means that 5% of 50 μm may be fluctuated on the basis of 50 μm. The phrase "about 700 μm" means that 5% of 700 μm may be fluctuated on the basis of 700 μm.

The line width of the antenna wiring 2 is about 50 μm to 700 μm. On one hand, a problem of a large resistance of the antenna wiring 2 due to a small line width of the antenna wiring 2 is able to be solved. On another hand, a large width of the peripheral area B of the display substrate 10 due to a large line width of the antenna wiring 2, which affects the narrow bezel design of the display apparatus in which the display substrate 10 is used, is able to be avoided.

Along the direction parallel to the substrate 1, the distance between two adjacent turns of the coil 24 is about 50 μm to 700 μm. On one hand, a problem that connection point(s) exist between two adjacent turns of the coil 24 due to a small distance between two adjacent turns of the coil 24 is able to be solved. On another hand, a large width of the peripheral area B of the display substrate 10 due to a large distance between two adjacent turns of the coil 24, which affects the narrow bezel design of the display apparatus in which the display substrate 10 is used, is able to be avoided.

In the case where only the single-turn coil 24 is disposed, the width of the single-turn coil 24 may be large, so that a resistance of the single-turn coil 24 is small. In the case where the multi-turn coil 24 is disposed along the direction X parallel to the substrate 1 and away from the display area A, the width of the multi-turn coil 24 may be appropriately reduced, or the distance between adjacent turns of the multi-turn coil 24 may be adjusted.

Figure 15:
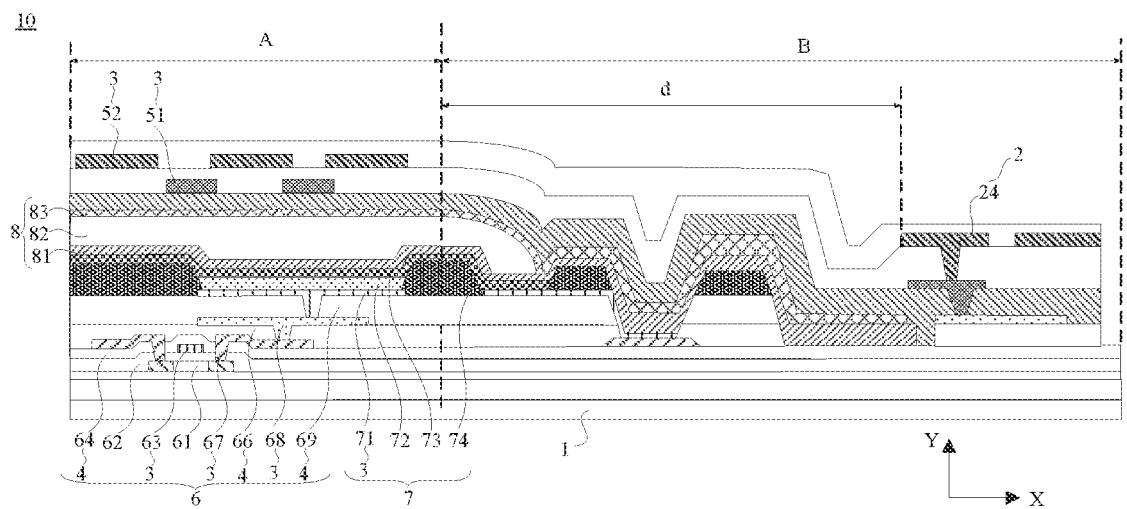
FIG. 15 is a structural diagram of yet another display substrate, in accordance with some embodiments.

In some embodiments, as shown in FIG. 15, a distance d from a boundary, proximate to the display area A, of the orthographic projection of the antenna wiring 2 on the substrate 1 to a boundary of the display area A is greater than or equal to about 20 μm. The phrase "about 20 μm" means that 5% of 20 μm may be fluctuated on the basis of 20 μm. In this way, the distance between the antenna wiring 2 and the display area A is large, so as to prevent the antenna wiring 2 from affecting the normal display of the display area A.

In some embodiments, referring to FIGS. 6 and 8, the display substrate 10 further includes a bonding region M located on a side of the peripheral area B away from the display area A. The display substrate 10 further includes two antenna pins 28 located in the bonding region M. An input end 201 of the antenna wiring 2 is connected to an antenna pin 28, and an output end 202 of the antenna wiring 2 is connected to another antenna pin 28. A free end of the extending portion 26 may be the input end 201 or the output end 202.

One of the two antenna pins 28 may be arranged in a same layer as one of the first source-drain electrode layer 67 and the second source-drain electrode layer 68, and another one of the two antenna pins 28 may be arranged in another same layer as another one of the first source-drain electrode layer 67 and the second source-drain electrode layer 68. Alternatively, the two antenna pins 28 may be arranged in a same layer as the gate layer 63. Positions of the two antenna pins 28 are not limited thereto.

Figure 16:
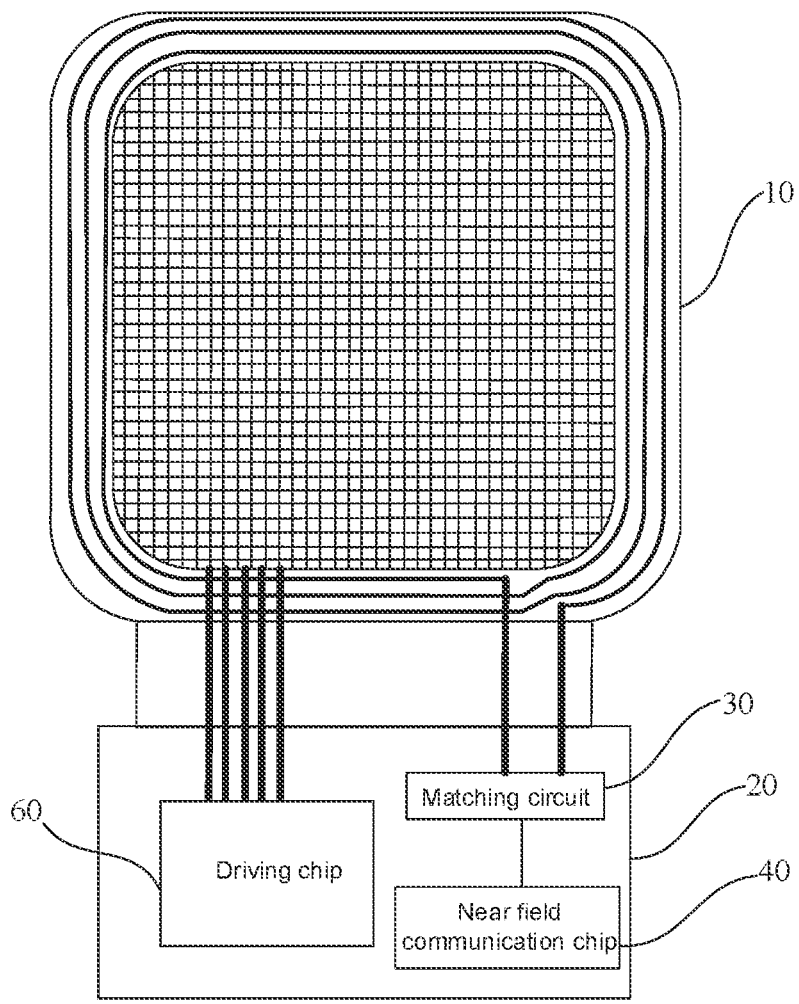
FIG. 16 is a structural diagram of a display module, in accordance with some embodiments.

As shown in FIG. 16, some embodiments of the present disclosure further provide a display module 100. The display module 100 includes the display substrate 10 in any one of the above embodiments and a flexible printed circuit 20 bonded to the display substrate 10. The flexible printed circuit 20 has a matching circuit 30 coupled to the antenna wiring 2, and a near field communication chip 40 coupled to the matching circuit 30. The flexible printed circuit 20 may further has a driving chip coupled to the pixel driving circuits 60.

Figure 17:
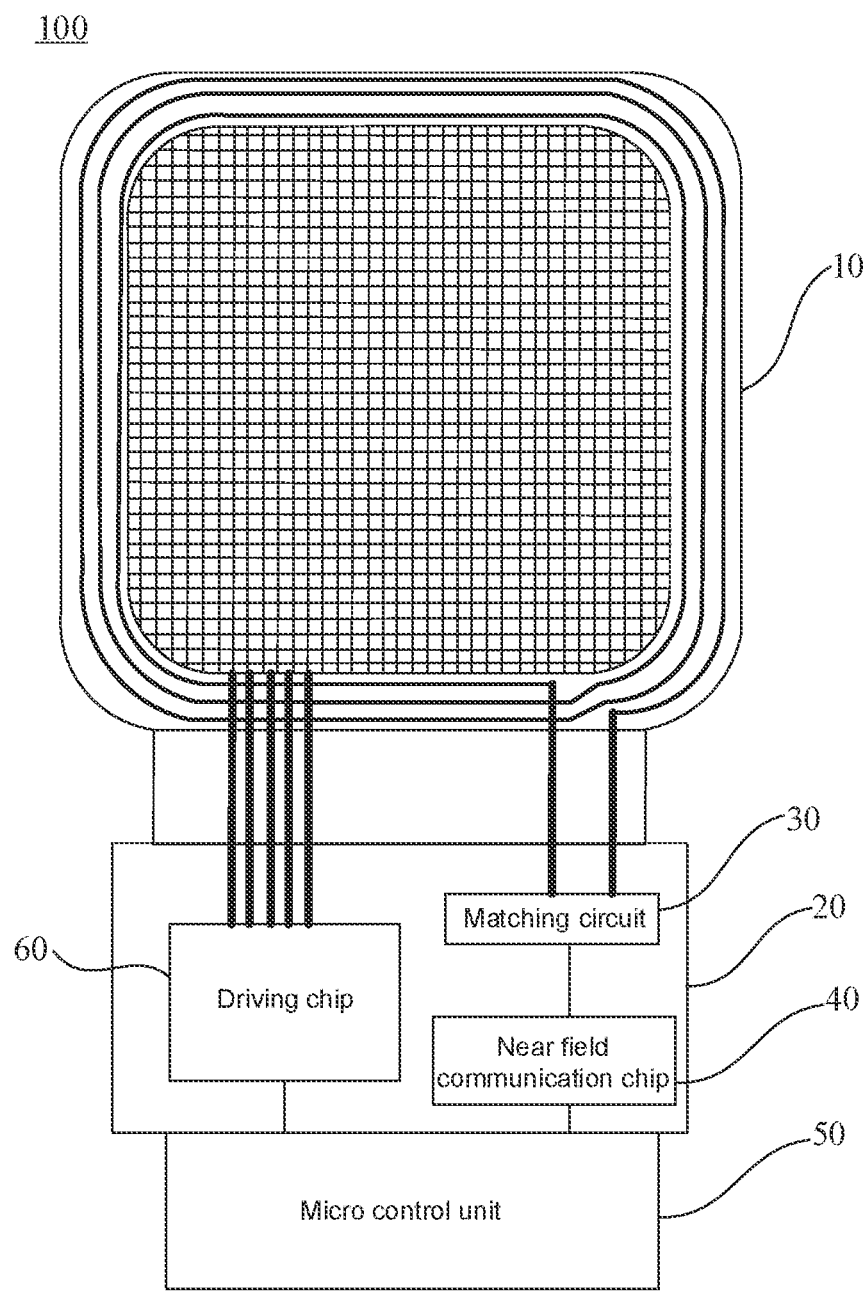
FIG. 17 is a structural diagram of another display module, in accordance with some embodiments.

In some embodiments, as shown in FIG. 17, the display module 100 further includes a micro control unit 50. The micro control unit 50 is coupled to the near field communication chip 40.

In some embodiments of the present disclosure, the near field communication chip 40 is integrated onto the flexible printed circuit 20, so that the near field communication chip 40 is directly communicated with the micro control unit 50.

Technical effects that may be achieved by the display module 100 in some embodiments of the present disclosure are the same as the technical effects that may be achieved by the display substrate 10, and will not be repeated here.

Figure 18:
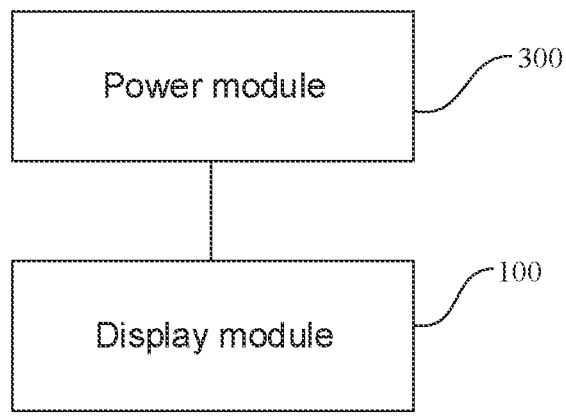
FIG. 18 is a structural diagram of a display apparatus, in accordance with some embodiments.

As shown in FIG. 18, some embodiments of the present disclosure further provide the display apparatus 200. The display apparatus 200 includes the display module 100 in any one of the above embodiments and a power module 300. The power module 300 is configured to supply power to the display module 100.

The display apparatus 200 may be any component with a display function, such as a television, a digital camera, a mobile phone, a watch, a tablet computer, a notebook computer, or a navigator.

Figure 19:
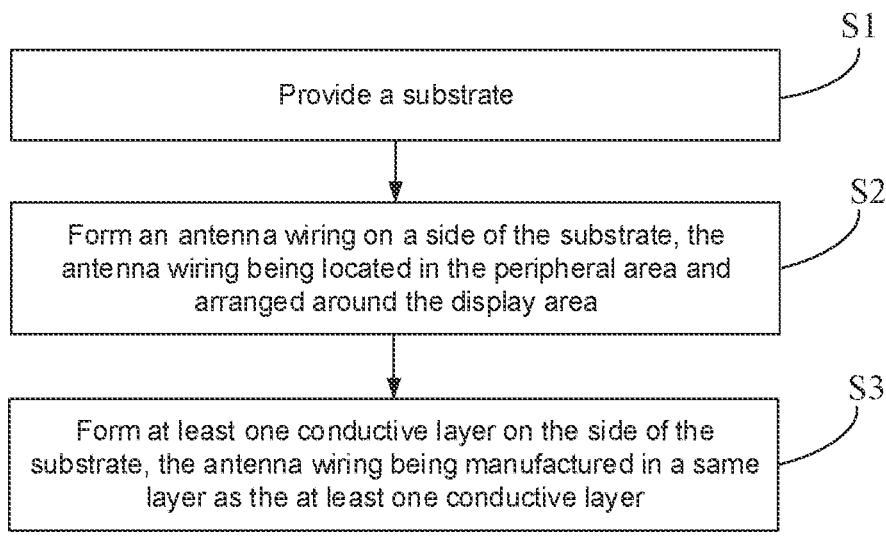
FIG. 19 is a flow diagram of a manufacturing method of a display substrate, in accordance with some embodiments.

As shown in FIG. 19, some embodiments of the present disclosure provide a manufacturing method of a display substrate 10. The display substrate 10 has a display area A and a peripheral area B adjacent to the display area A. The manufacturing method of the display substrate 10 includes S1 to S3.

In S1, a substrate 1 is provided.

In S2, an antenna wiring 2 is formed on a side of the substrate 1. The antenna wiring 2 is located in the peripheral area B, and is arranged around the display area A.

In S3, at least one conductive layer 3 is formed on the side of the substrate 1. The antenna wiring 2 is manufactured in a same layer as the at least one conductive layer 3.

Technical effects that may be achieved by the manufacturing method of the display substrate 10 in some embodiments of the present disclosure are the same as the technical effects that may be achieved by the display substrate 10, and will not be repeated here.

The foregoing descriptions are merely specific implementations of the present disclosure. However, the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate having a display area and a peripheral area adjacent to the display area, the display substrate comprising:
   a substrate;
   an antenna wiring disposed on a side of the substrate; the antenna wiring being located in the peripheral area and arranged around the display area; and
   at least one conductive layer located on the side of the substrate, wherein the antenna wiring is arranged in a same layer as the at least one conductive layer;
   wherein the at least one conductive layer includes a first touch electrode layer, a second touch electrode layer, a first source-drain electrode layer and a second source-drain electrode layer, the second touch electrode layer is located on a side of the first touch electrode layer away from the substrate, and the second source-drain electrode layer is located between the first source-drain electrode layer and the first touch electrode layer;
   the antenna wiring includes a first portion arranged in a same layer as the second touch electrode layer, a second portion arranged in a same layer as the second source-drain electrode layer, and a third portion arranged in a same layer as the first touch electrode layer;
   the second portion and the first portion are connected in parallel through at least one first via hole in at least one insulating layer located between the second touch electrode layer and the second source-drain electrode layer; and the third portion and the first portion are connected in parallel through at least one second via hole in at least one insulating layer located between the first touch electrode layer and the second touch electrode layer; and the first via hole penetrates through the third portion.

2. The display substrate according to claim 1, wherein along an extending direction of the antenna wiring, the first via hole and the second via hole are alternately arranged.

3. The display substrate according to claim 1, further comprising:
an encapsulation layer located on a side of the first touch electrode layer proximate to the substrate; wherein
orthogonal projections of the first via hole and the second via hole on the substrate are located outside an orthographic projection of the encapsulation layer on the substrate.

4. The display substrate according to claim 1, further comprising:
a voltage signal line located in the peripheral area and surrounding the display area; wherein the voltage signal line is arranged in a same layer as the first source-drain electrode layer or the second source-drain electrode layer; and
an orthographic projection of the antenna wiring on the substrate is located on a side, away from the display area, of an orthographic projection of the voltage signal line on the substrate.

5. The display substrate according to claim 1, further comprising:
touch wirings, wherein the touch wirings are arranged in a same layer as the first touch electrode layer or the second touch electrode layer; or part of the touch wirings are arranged in a same layer as the first touch electrode layer, and another part of the touch wirings are arranged in another same layer as the second touch electrode layer; wherein
at least a portion of an orthographic projection of the antenna wiring on the substrate is located on a side, proximate to an outer edge of the peripheral area, of orthographic projections of the touch wirings on the substrate.

6. The display substrate according to claim 5, wherein a first overlapped region exists between the orthographic projection of the antenna wiring on the substrate and the orthographic projections of the touch wirings on the substrate, and in the first overlapped region, the antenna wiring and the touch wirings are arranged in different layers.

7. The display substrate according to claim 1, further comprising:
at least one first blocking dam located in the peripheral area and arranged around the display area; wherein
an orthographic projection of the antenna wiring on the substrate is located on a side, away from the display area, of an orthographic projection of the at least one first blocking dam on the substrate; or the orthographic projection of the antenna wiring on the substrate is partially overlapped with an orthographic projection of a first blocking dam of the at least one first blocking dam farthest from the display area on the substrate.

8. The display substrate according to claim 1, further comprising:
an inorganic insulating layer located on a surface of the substrate proximate to the at least one conductive layer; the inorganic insulating layer extending from the display area to the peripheral area, and a portion of the inorganic insulating layer away from the display area including at least one groove; and
a second blocking dam, an orthographic projection of the second blocking dam on the substrate being overlapped with an orthographic projection of the at least one groove on the substrate.

9. The display substrate according to claim 1, wherein the antenna wiring surrounds the display area to form a single-turn coil; wherein
the single-turn coil extends at least from a first position of a side of the display area around the display area to a second position of the side of the display area that is opposite to the first position.

10. The display substrate according to claim 1, wherein the antenna wiring includes a multi-turn coil that is spirally arranged along a direction parallel to the substrate and away from the display area;
one of turns of the multi-turn coil proximate to the display area is a first coil; and
the antenna wiring further includes an extending portion connected to an open end of the first coil; a second overlapped region exists between an orthographic projection, on the substrate, of the extending portion and an orthographic projection, on the substrate, of at least one of the turns of the multi-turn coil except the first coil, the at least one turn being a second coil; and in the second overlapped region, the extending portion is arranged in a different layer from the second coil.

11. The display substrate according to claim 1, wherein a distance from a boundary, proximate to the display area, of an orthographic projection of the antenna wiring on the substrate to a boundary of the display area is greater than or equal to about 20 μm.

12. The display substrate according to claim 1, further having a bonding region located on a side of the peripheral area away from the display area; the display substrate further comprising:
two antenna pins located in the bonding region; wherein
an input end of the antenna wiring is connected to one of the antenna pins, and an output end of the antenna wiring is connected to another one of the antenna pins.

13. A display module, comprising:
the display substrate according to claim 1; and
a flexible printed circuit bonded to the display substrate, the flexible printed circuit having a matching circuit coupled to the antenna wiring and a near field communication chip coupled to the matching circuit.

14. The display module according to claim 13, further comprising:
a micro control unit coupled to the near field communication chip.

15. A display apparatus, comprising:
the display module according to claim 13; and
a power module configured to supply power to the display module.

16. A manufacturing method of a display substrate, wherein the display substrate has a display area and a peripheral area adjacent to the display area; the manufacturing method of the display substrate comprising:
providing a substrate;
forming an antenna wiring on a side of the substrate, the antenna wiring being located in the peripheral area and arranged around the display area; and forming at least one conductive layer on the side of the substrate, wherein the antenna wiring is manufactured in a same layer as the at least one conductive layer;

wherein the at least one conductive layer includes a first touch electrode layer, a second touch electrode layer, a first source-drain electrode layer and a second source-drain electrode layer, the second touch electrode layer is located on a side of the first touch electrode layer away from the substrate, and the second source-drain electrode layer is located between the first source-drain electrode layer and the first touch electrode layer;

the antenna wiring includes a first portion arranged in a same layer as the second touch electrode layer, a second portion arranged in a same layer as the second source-drain electrode layer, and a third portion arranged in a same layer as the first touch electrode layer;

the second portion and the first portion are connected in parallel through at least one first via hole in at least one insulating layer located between the second touch electrode layer and the second source-drain electrode layer; and the third portion and the first portion are connected in parallel through at least one second via hole in at least one insulating layer located between the first touch electrode layer and the second touch electrode layer; and the first via hole penetrates through the third portion.

17. The display substrate according to claim 1, wherein the antenna wiring includes a multi-turn coil that is spirally arranged along a direction perpendicular to the substrate; wherein the at least one conductive layer includes a plurality of conductive layers, and every two adjacent conductive layers are provided with at least one insulating layer therebetween; and two adjacent turns of the multi-turn coil are connected in series through at least one third via hole in the at least one insulating layer.

* * * * *